(12) United States Patent
Young et al.

(10) Patent No.: US 6,489,719 B1
(45) Date of Patent: Dec. 3, 2002

(54) ORGANIC ELECTROLUMINESCENT DEVICE

(75) Inventors: Edward W. A. Young, Eindhoven (NL); Klaas W. Kerkhof, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/575,973

(22) Filed: May 23, 2000

(30) Foreign Application Priority Data

Jun. 3, 1999 (EP) ............................................. 99201757

(51) Int. Cl.[7] ................................................ H01J 63/04
(52) U.S. Cl. ......................................................... 313/512
(58) Field of Search ........................................ 313/512

(56) References Cited

U.S. PATENT DOCUMENTS 5,124,204 A * 6/1992 Yamashita et al. .......... 428/331
6,111,357 A * 8/2000 Fleming et al. .............. 313/509
6,210,815 B1 * 4/2001 Ooishi .......................... 428/690
6,268,071 B1 * 7/2001 Yasukawa et al. ........... 428/690
6,284,342 B1 * 9/2001 Ebisawa et al. ............... 428/69

FOREIGN PATENT DOCUMENTS

WO    WO9853644    11/1998    ........... H05B/33/02

* cited by examiner

Primary Examiner—Robert H. Kim
Assistant Examiner—Jurie Yun
(74) Attorney, Agent, or Firm—Aaron Waxler

(57) ABSTRACT

An EL device according to the invention comprises a seal of an organic sealing material which substantially does not extend inside the inner perimeter 8 of the sealing surface. To be able to provide the sealing material between the sealing surfaces by capillary action, the seal has a thickness of less than 100 micrometers. Preferably, the seal has a thickness of less than 10 micrometers and a width of more than 0.2 mm, so that the diffusion of volatile materials through the seal is greatly reduced.

5 Claims, 5 Drawing Sheets

ORGANIC ELECTROLUMINESCENT DEVICE

BACKGROUND OF THE INVENTION

The invention relates to an electroluminescent device comprising:
an electroluminescent element having an electroluminescent organic layer disposed between a
hole-injecting electrode and an electron-injecting electrode, and
a housing enclosing said electroluminescent element, said housing comprising
a first shaped part having a first sealing surface,
a box-like second shaped part having a second sealing surface with an -inner perimeter,
said electroluminescent element being mounted on said first shaped part,
said first and second shaped parts being connected to each other by means of a seal comprising
a closed ring of a sealing material extending between said first and second sealing surfaces.

OBJECTS AND SUMMARY OF THE INVENTION

The invention further relates to a method of manufacturing such an electroluminescent device.

An electroluminescent (EL) device is a device which, while making use of the phenomenon of electroluminescence, emits light when the device is suitably connected to a power supply. If the light emission originates from an organic material, said device is referred to as an organic electroluminescent device. An organic EL device may be used, inter alia, as a thin light source having a large luminous surface area, such as a backlight for a liquid crystal display or a watch. An organic EL device may also be used as a display if the EL device comprises a number of EL elements, which may or may not be independently addressable.

The use of organic layers as EL layers in an EL element is known. Known organic layers generally comprise a conjugated, luminescent compound. Said compound may be a low-molecular dye, such as a coumarin, or a high-molecular compound, such as a (poly)phenylenevinylene. The EL element also comprises two electrodes, which are in contact with the organic layer. By applying a suitable voltage, the negative electrode, i.e. the cathode, will inject electrons and the positive electrode, i.e. the anode, will inject holes. If the EL element is in the form of a stack of layers, at least one of the electrodes should be transparent to the light to be emitted. A known transparent electrode material for the anode is, for example, indium tin oxide (ITO). Known cathode materials are, inter alia, Al, Yb, Mg:Ag, Li:Al or Ca. Known anode materials are, in addition to ITO, for example, gold and platinum. If necessary, the EL element may comprise additional organic layers, for example, of an oxadiazole or a tertiary amine, which serve to improve the charge transport or the charge injection.

An EL device of the type mentioned in the opening paragraph is disclosed in PCT application WO 98/53644. In said known organic device, the sealing material is low-melting metal or a low-melting metal alloy. This metal material is used according to PCT application WO 98/53644. Experiments showed that the housing should be airtight and waterproof to such an extent that organic sealing materials cannot be employed as barrier materials in the housing. Even epoxy-based adhesives and high-molecular, halogenated or non-halogenated hydrocarbons, which are reputed to be the best barrier materials within the class of organic materials, are unsuitable. Furthermore, apart from the worse barrier properties, the large difference between the coefficients of expansion of organic sealing materials and, for example, glass, and the resulting bonding problems proved to be disadvantageous.

However, although in some applications the known device proves to be satisfactory, there are applications, especially for very small pitch EL devices, or devices for which the inherent electrical conductivity of the metal poses a problem, for which the use of metal sealing material is not satisfactory.

The invention aims to provide a device as described in the opening paragraph, which overcomes the problems of using metal sealing material.

To this end, the device is characterized in that the sealing material comprises an organic sealing material, and in the direction towards the interior of the second part, the sealing material maximally extends to the inner perimeter of the second sealing surface.

The inventors have realized that, although PCT application WO 98/53644 states that 'organic materials cannot be used as barrier materials', organic materials can in fact be used as sealing materials, provided that specific conditions, as described above, are met.

Hitherto, when organic sealing materials were used, such materials were provided on one of the parts in a relatively thick layer, whereafter the two parts were pressed upon each other. The seal had a thickness of several tens of micrometers, and inherently some sealing material was pushed inside the housing. This gives rise to at least two problems.

Almost all organic materials comprise gases. They also permit diffusion, particularly of moisture through the material. The outgassing of said organic materials and the diffusion through the organic materials gives rise to the rapid degradation of the EL element as described in PCT application WO 98/53644.

In the device in accordance with the invention, the sealing material between the first and the second part comprises an organic sealing material, and in the direction towards the interior of the second part, the sealing material maximally extends to the inner perimeter of the second sealing surface. In said device, substantially no sealing material is present inside the housing. This strongly reduces the amount of gas that is released by the organic material due to outgassing.

In the device in accordance with the invention, the organic sealing material preferably has a thickness of is less than 100 micrometers at any position between the first and second sealing surfaces. Below this limit, capillary action can be used to deposit the sealing material between the sealing surfaces.

In the device in accordance with the invention, the organic sealing material preferably has a thickness of less than 10 micrometer, at any position between the first and second sealing surfaces, and a distance of at least 0.2 mm between the outer and inner perimeter of the seal throughout the ring. The strongly reduced thickness of the sealing material in combination with a width of at least 0.2 mm of the ring provides a strongly increased resistance to diffusion of moisture through the seal.

Further advantages are a reduced amount of material used. The reduced thickness of the seal also alleviates bonding problems and increases the strength of the seal.

Preferably, the organic sealing material is chosen from the group of epoxy-based adhesives and high-molecular, halogenated or non-halogenated hydrocarbons. The diffusion of moisture through such materials is relatively small.

Preferably, the organic sealing material comprises inorganic particles. Such particles may be, for example, $Al_2O_3$, $SiO_2$ or Mg-silicate particles. The presence of such particles effectively increases the diffusion path length for moisture, because the moisture does not diffuse or diffuses much more slowly through inorganic materials. This increase of the diffusion path length decreases diffusion of moisture through the seal. The amount of organic sealing material (at an equal thickness of the seal) is also reduced, which reduces the amount of gas that may be released by the organic sealing material.

The method of the invention is characterized in that the connecting step comprises the steps of bringing the sealing surfaces of the first and the second part near or against each other; providing an organic sealing material around the outer perimeter of the contact area between the first and the second part and allowing the organic sealing material to be deposited between the sealing surfaces by capillary action. The method in accordance with the invention has the advantage that the transport of the sealing material is stopped as soon as the sealing material reaches the inner perimeter of the second sealing surface. Sealing material is therefore substantially absent in the inner part of the housing.

'Near' or 'against' is understood to be direct contact, including a position at a distance conducive to capillary action, and comprising embodiments in which spacers are positioned in between the first and the second part,. When incorporated in the seal, said spacers may also decrease diffusion by increasing the effective diffusion path length.

Preferably, the sealing material is provided at a temperature at which no transport through capillary action takes place, which temperature is subsequently raised to such a value that transport of organic sealing material through capillary action takes place. The advantage of providing the sealing material at a cold 'immobile' temperature' and subsequently raising the temperature to a 'capillary active' temperature is that, prior to actual sealing, the provision of the sealing material can be checked.

As compared with the provision of sealing material in a layer on one or both sealing surfaces, much less material needs to be used. Due to inaccuracies and surface irregularities, an applied layer must usually have a larger thickness than the actual sealing layer to insure that sealing material touches both surfaces even at the positions where the gaps are largest. This means that a substantially larger sealing material layer (2× micrometers) must be applied for an average seal thickness of x micrometer. Part or even a major part of the surplus sealing material will be pushed inside the housing. The method in accordance with the invention does not suffer from these problems, because substantially the entire sealing surface of the parts are provided with sealing material, without sealing material being pushed or otherwise finding its way inside the housing.

These and other aspects of the invention are apparent from and will be elucidated with reference to the embodiments described hereinafter.

DESCRIPTION OF THE PREFERRED EMBODIMENTS

Figure 1:
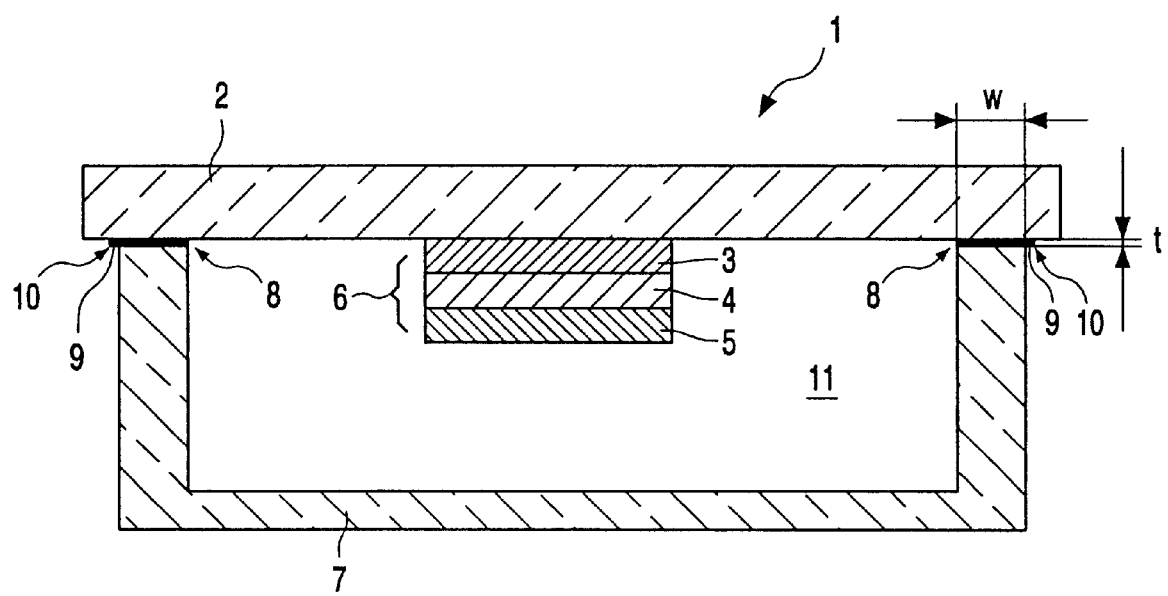
FIG. 1 is a schematic, cross-sectional view of a first embodiment of the EL device in accordance with the invention.

FIG. 1 is a schematic, cross-sectional view of a first embodiment of an EL device 1 in accordance with the invention. For the sake of clarity, this and subsequent drawings are not drawn to scale and some parts are drawn on a larger scale relative to other parts. The EL device 1 comprises an EL element 6 inside a chamber 11. The EL element 6 has an electroluminescent organic layer 4 disposed between a hole-injecting electrode 3, which is transparent to the light to be emitted, and an electron-injecting electrode 5. The EL element 6 is enclosed by an airtight and waterproof housing, which is formed by the parts 2 and 7. The housing comprises a first part in the form of a glass plate 2, which is transparent to the light to be emitted. The EL element 6 is mounted on the plate 2, thus serving as a substrate for the EL element 6. The housing further comprises a box-like second shaped part 7 having a second sealing surface with an inner perimeter 8 and an outer perimeter 10. The parts 2 and 7 are connected to each other by means of a seal 9 so as to hermetically seal the airtight and waterproof housing. The closed ring of sealing material 9 is made of organic material having a thickness t (greatly exaggerated in this Figure) and a width w.

Figure 2A:
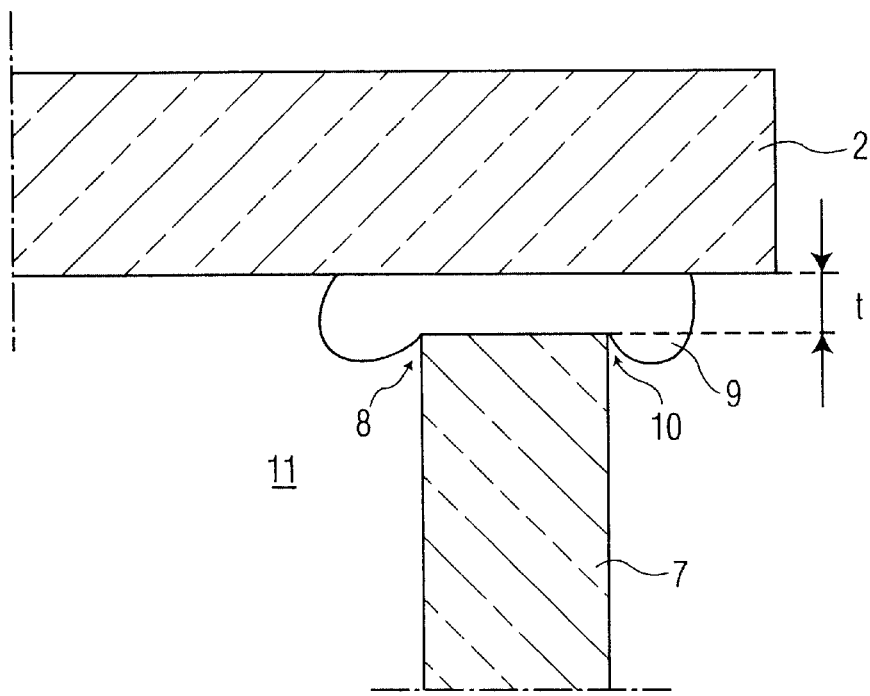
FIGS. 2A and 2B are schematic, cross-sectional views of a detail of an EL device in accordance with the known devices (2A) and the invention (2B), respectively.
Figure 2B:
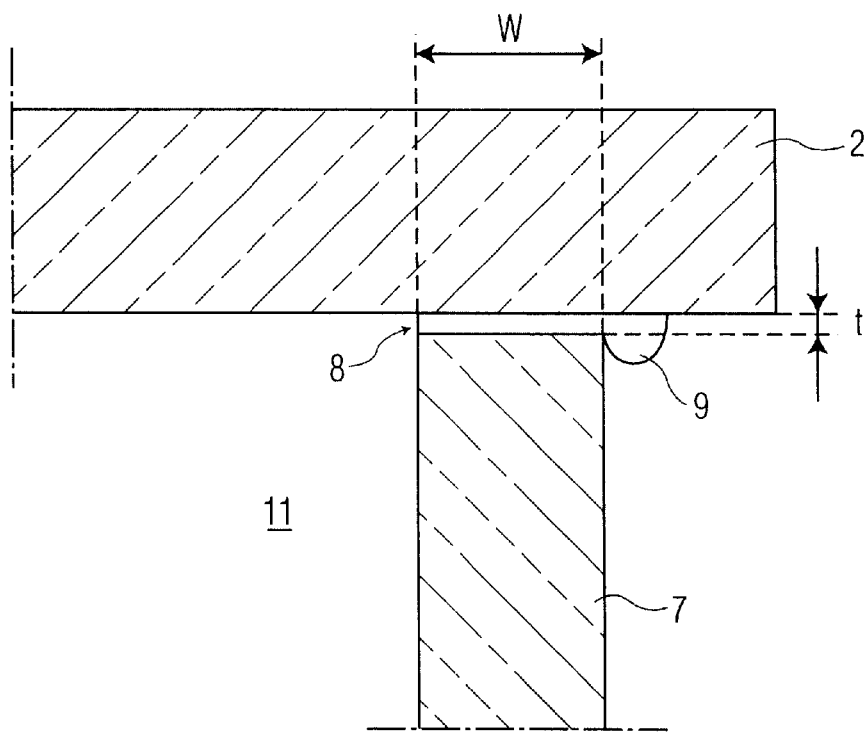

FIGS. 2A and 2B are schematic, cross-sectional views of a detail of an EL device in accordance with the known devices (2A) and the invention (2B), respectively, using organic sealing materials. Conventionally (FIG. 2A), a blob of organic sealing material is present at the inner 8 and outer 9 perimeter of the second sealing surface, with a width of said blob sealing material of typically several tens of micrometers, and the blob which is present at the inner perimeter 8 extends inside the chamber 11. As described in PCT application WO 98/53644, the organic sealing material is in fact unsuitable in such devices. The inventors have realized that this fact is based on one or both of the following reasons:

an appreciable amount of organic material 9 is present inside the chamber 11, which material releases gases which affecting the EL device in the course of time, moisture and/or other volatile materials diffuse through the material 9 and enter chamber 11, reacting subsequently with EL element 6.

In a device according to the invention, substantially no sealing material 9 is present inside the chamber 11. The amount of gas released by the sealing material 9 inside the chamber 11 is strongly reduced. A method of establishing this is to use capillary action as the driving force for depositing the sealing material between the sealing surfaces. The use of capillary action sets an upper limit to the thickness of the sealing material, which thickness is preferably less than 100 micrometers. A reduced distance between the first and second sealing surfaces (for example, 25 micrometers or less) yields an increase of the capillary force and a decrease of the thickness of the sealing material. The increased capillary force may be used to deposit sealing material with a high viscosity between the sealing surfaces.

The decrease of the thickness of the sealing material yields an increase of the diffusion resistance of the seal.

The thickness of the sealing material is not the only parameter that determines the resistance against diffusion. The diffusion resistance is also dependent on, for example, the width of the seal. To ensure a sufficient diffusion resistance, the sealing material preferably has a thickness of less than 10 micrometers and a width w of at least 0.2 mm. As a result, the lifetime of EL element 6 is strongly increased. Furthermore the reduced thickness increases the strength of the bond and reduces problems which may be caused by differences in thermal expansion coefficients of material 9 and parts 2 and 7.

Figure 3:
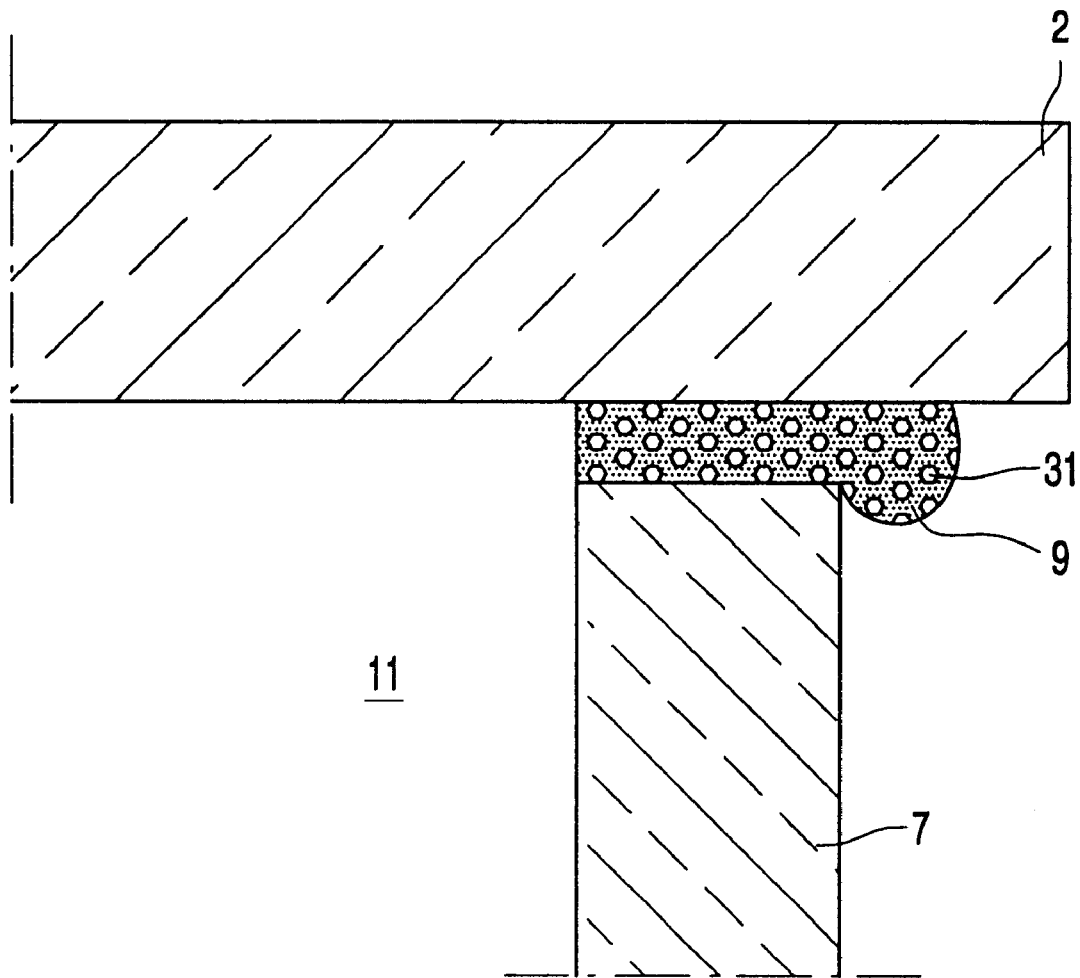
FIG. 3 is a schematic, cross-sectional view of a detail of an embodiment of the EL device in accordance with the invention.

FIG. 3 shows an organic sealing material comprising inorganic particles 31. Such particles increase the diffusion resistance.

By way of example, the EL device 1 is manufactured as follows (FIG. 1). A thin layer of organic sealing material 9 is sprayed or printed in a thickness of approximately 10 micrometers or less on the sealing areas of part 7. During such spraying or printing, the inner areas of part 7 are protected (for example, by being covered) so that no sealing material will be present inside chamber 11 within the housing. The parts 7 and 2 are pressed together and the organic sealing material is cured. Although it is possible to manufacture a device in accordance with the invention, it is difficult to prevent sealing material from entering the chamber 11. The pressing together of the parts will cause some inward movement of the sealing material. It is also very difficult to prevent gases from being trapped in the sealing material. The problems can even be greater when, for example, the opposite areas of part 2 and 7 are somewhat slanted or when, during pressing, the parts slip with respect to each other. One possible remedy for this is to leave an edge free of sealing material around the inner perimeter of part 7. This will, however, reduce the width of the seal and decrease the diffusion resistance. It will also reduce the strength of the seal. This method may be used if, for example, the surfaces are smooth and even.

Figure 4A:
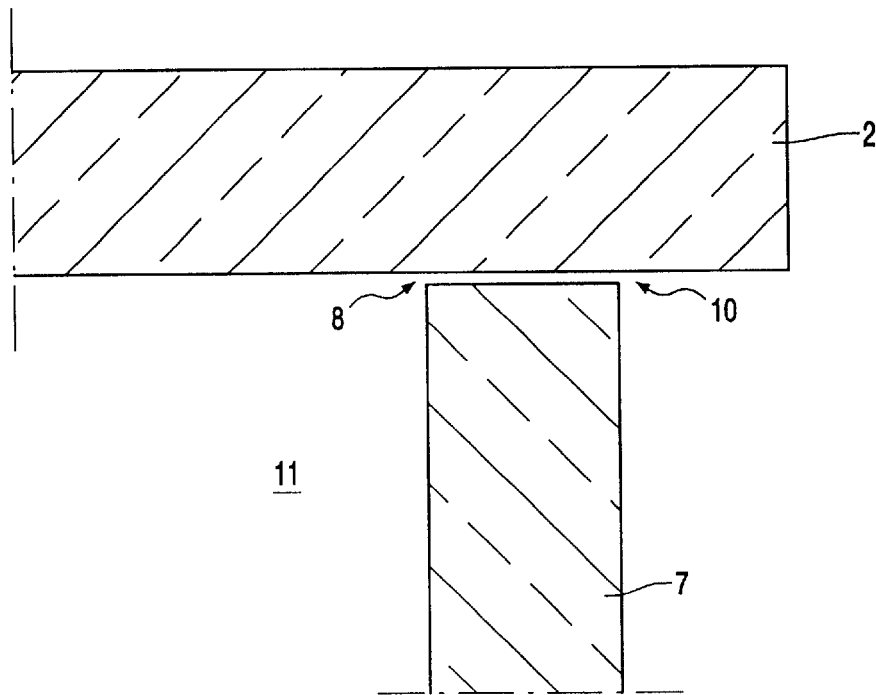
FIGS. 4A to 4C are schematic, cross-sectional views illustrative of a method in accordance with the invention.
Figure 4B:
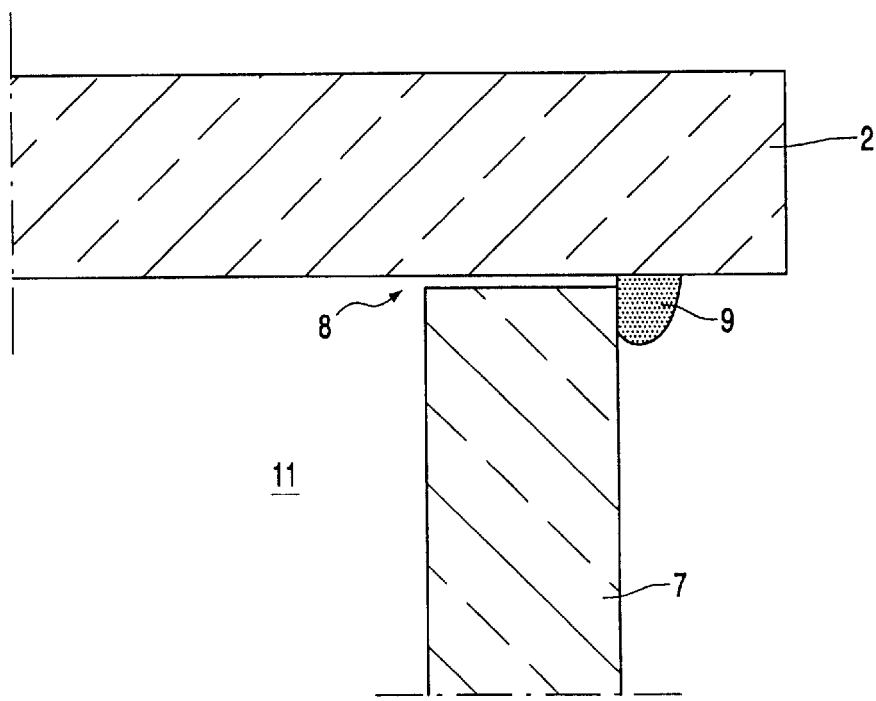
Figure 4C:
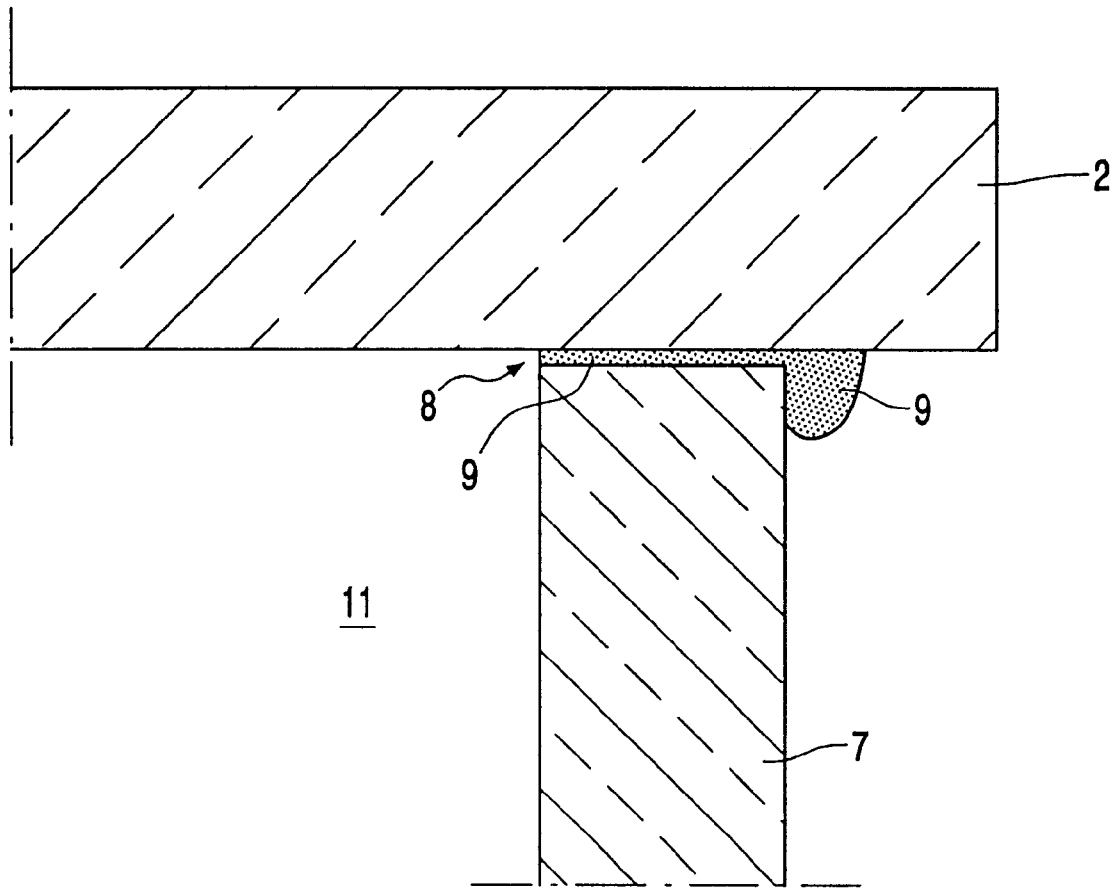

FIGS. 4A to 4C illustrate the method in accordance with the invention. Parts 7 and 2 are placed near or against each other. The sealing surfaces are flat to within several micrometers (FIG. 4A). Sealing material 9 is provided around the outer perimeter 10 of the part 7 at a temperature at which the sealing material does not cure or flows (FIG. 4B). The sealing material may be, for example, an epoxy resin. Subsequently, the temperature is raised to a value at which the sealing material starts to flow and, by capillary action, will start to flow in between the parts 7 and 2. As soon as the material reaches the inner perimeter 8 of part 7, however, the force driving the flow of material, namely capillary action, is reduced to zero. Therefore, substantially no material will flow inside the chamber 11. By capillary action, the sealing material will fill up all available space and gases will not (or much less) be trapped in the seal. Even if the surfaces are less smooth and even, the sealing material will fill up all available space and yield a good reliable seal without needing excess material. The capillary action preferably takes place at a raised temperature because this enables the sealing material to be provided without immediate sealing action. The quantity of sealing material to be provided and the positions in which it is to be provided can be better controlled.

Subsequently, the sealing material is cured. This can be accomplished by raising the temperature even higher, or by other means such as by illumination with UV light. A very thin layer of sealing material is thus provided. When using temperature curing, the curing temperature is preferably at least 10 degrees Celsius higher than the temperature required for the capillary action. On the one hand, the sealing material this prevents from curing while it is filling the gap between the parts and, on the other hand, it prevents the need to raise the temperature too high, which may cause thermal stresses.

In summary, an EL device according to the invention comprises a seal an organic sealing material which substantially does not extend inside the inner perimeter 8 of the sealing surface. To be able to provide the sealing material between the sealing surfaces by capillary action, the seal has a thickness of less than 100 micrometers. Preferably, the seal has a thickness of less than 10 micrometers and a width of more than 0.2 mm, so that the diffusion of volatile materials through the seal is greatly reduced.

It will be evident that many variations are possible within the scope of the invention as claimed.

What is claimed is:

1. An electroluminescent device comprising:

an electroluminescent element having an electroluminescent organic layer disposed between a hole-injecting electrode and an electron-injecting electrode, and a housing enclosing said electroluminescent element, said housing comprising
   a first shaped part having a first sealing surface,
   a box-like second shaped part having a second sealing surface with an inner perimeter,
   said electroluminescent element being mounted on said first shaped part,
   said first and second shaped parts being connected to each other by means of a seal comprising a closed ring of a single sealing material extending between said first and second sealing surfaces, characterized in that the sealing material comprises an organic sealing material, and in the direction towards the interior of the second part, the sealing material maximally extends to the inner perimeter of the second sealing surface.

2. An electroluminescent device as claimed in claim 1, characterized in that the organic sealing material has a thickness of less than 100 micrometers at any position between the first and second sealing surfaces.

3. An electroluminescent device as claimed in claim 2, characterized in the organic sealing material has a thickness of less than 10 micrometers that at any position between the first and second sealing surfaces, and a distance of at least 0.2 mm between the outer and inner perimeter of the seal throughout the ring.

4. An electroluminescent device as claimed in claim 1, characterized in that the organic sealing material is chosen from the group of epoxy-based adhesives and high-molecular, halogenated or non-halogenated hydrocarbons.

5. An electroluminescent device as claimed in claim 1, characterized in that the organic sealing material comprises inorganic particles.

* * * * *